(12) United States Patent
Amato

(10) Patent No.: US 7,019,358 B2
(45) Date of Patent: Mar. 28, 2006

(54) HIGH VOLTAGE SEMICONDUCTOR DEVICE HAVING AN INCREASED BREAKDOWN VOLTAGE RELATIVE TO ITS ON-RESISTANCE

(75) Inventor: Michael Amato, Newburyport, MA (US)

(73) Assignee: Clare, Inc., Beverly, MA (US)

( * ) Notice: Subject to any disclaimer, the term of this patent is extended or adjusted under 35 U.S.C. 154(b) by 0 days.

(21) Appl. No.: 10/631,081

(22) Filed: Jul. 31, 2003

(65) Prior Publication Data

US 2005/0023605 A1 Feb. 3, 2005

(51) Int. Cl.
*H01L 21/332* (2006.01)

(52) U.S. Cl. ............... 257/328; 257/330; 257/332; 257/502

(58) Field of Classification Search ............... 257/328, 257/330, 332, 502
See application file for complete search history.

(56) References Cited

U.S. PATENT DOCUMENTS

| | | | | |
|---|---|---|---|---|
| 5,272,098 A | * | 12/1993 | Smayling et al. | 438/268 |
| 5,960,277 A | * | 9/1999 | Blanchard | 438/234 |
| 6,133,606 A | * | 10/2000 | Tung | 257/332 |
| 6,172,398 B1 | * | 1/2001 | Hshieh | 257/330 |
| 6,188,105 B1 | * | 2/2001 | Kocon et al. | 257/330 |
| 6,426,260 B1 | * | 7/2002 | Hshieh | 438/270 |
| 6,518,618 B1 | * | 2/2003 | Fazio et al. | 257/315 |
| 6,576,954 B1 | * | 6/2003 | Madson et al. | 257/330 |
| 6,713,813 B1 | * | 3/2004 | Marchant | 257/330 |
| 6,784,505 B1 | * | 8/2004 | Zeng | 257/397 |
| 6,818,513 B1 | * | 11/2004 | Marchant | 438/270 |
| 6,900,523 B1 | * | 5/2005 | Qu | 257/618 |
| 2005/0023605 A1 | * | 2/2005 | Amato | 257/328 |

* cited by examiner

*Primary Examiner*—Laura M. Schillinger
(74) *Attorney, Agent, or Firm*—McDermott Will & Emery LLP

(57) ABSTRACT

A semiconductor device includes a substrate layer having a first dopant density, an epitaxial layer comprising a second dopant density formed on the substrate layer and a semiconductor switch formed on the epitaxial layer, wherein the semiconductor switch comprises an active region of the semiconductor device. A first thickness of the epitaxial layer in the active region is less than a second thickness of the epitaxial layer in a termination region formed peripherally to the active region. The increased thickness of the epitaxial layer in the termination region enables the semiconductor device to have a relatively higher breakdown voltage without increasing the on-resistance of the semiconductor switch.

3 Claims, 6 Drawing Sheets

HIGH VOLTAGE SEMICONDUCTOR DEVICE HAVING AN INCREASED BREAKDOWN VOLTAGE RELATIVE TO ITS ON-RESISTANCE

FIELD OF THE INVENTION

The present invention relates generally to semiconductor devices and, more particularly, to a semiconductor device having an increased breakdown voltage relative to its on-resistance.

BACKGROUND OF THE INVENTION

Planar, vertical, high-voltage, power MOSFETs are typically constructed using N− epitaxial layer on a N+ substrates. Such a device 10 is shown in FIG. 1. Device 10 includes an N+ substrate 12 on which an N− epitaxial layer is grown. The source and gate components 16 of the device 10 are then constructed on the expitaxial layer 14. In such devices, it is desirable to reduce the on-resistance of the device while maintaining the breakdown voltage at a reasonable level. The on-resistance of the device is a function of the voltage rating of the material that forms the epitaxial layer, such that a higher voltage rating results in a higher on-resistance for the device, as shown in FIG. 2. Since the voltage rating is a function of the doping density and the thickness of the epitaxial layer, for a given doping density, the thickness of the epitaxial layer can be manipulated to vary the on-resistance of the device.

In lower voltage power transistors, such as shown at 20 in FIG. 3 and 21 in FIG. 4, the epitaxial layers 22 and 23, respectively, are relatively thin. In device 20, FIG. 3, the gate 24 is recessed into the epitaxial layer 22 as shown. A trench 26 is formed in the substrate 28, which serves to lower the device on-resistance by reducing the JFET pinch effects. However, because the epitaxially layer 22 under the gate 24 is similar in thickness to the epitaxial layer 14 in device 10, FIG. 1, the improvement in on resistance is marginal. In device 21, FIG. 4, the epitaxial layer 23 is trenched and the gate 25 is recessed to reduce the JFET pinch resistance and improve the channel packing density. In devices 20 and 21, the breakdown voltage of the device may be lowered by the increased exposure of the gate to the epitaxial region defined by each of the thicknesses $T_{B2}$ and $T_{B3}$.

In some high-voltage devices, such as is shown at 40 in FIG. 5, in order to increase the breakdown voltage of the device, the epitaxial layer 42 is formed to be relatively thick and is of a relatively lower doping density. A trench 44 may be included in the substrate 46. However, the epitaxial region is planarized during the epitaxy growth period, and this configuration causes the on-resistance of the device to be higher than the planar device 10 of FIG. 1 for an equivalent doping density and thickness $T_{B1}$ and $T_{B4}$, since $T_{A4}$ is now larger than $T_{A1}$.

These and other attempts at improving the on resistance of the power transistor do so by improving the efficiency of the current flow from the top of the epitaxy layer to the substrate. However, they do not change the relationship between the thickness and doping of the epitaxial layer and the maximum breakdown of the device structure.

SUMMARY OF THE INVENTION

The present invention is directed to a semiconductor configuration which enables the devices formed thereon to have increased breakdown voltages without increasing the on-resistance of the devices, or to reduce the on resistance of the device while the breakdown voltage is maintained. In the active region of the semiconductor device, the substrate is formed to be thicker than in the termination region of the device. This results in the epitaxial layer being thinner in the active region than in the termination region. This configuration results in the breakdown voltages of the devices being increased without increasing the on-resistance of the devices.

This configuration also allows the epitaxial layer to be thinner in the active region while maintaining the doping density without reducing the breakdown voltage. These two methods of breakdown and/or on resistance improvement are compatible with other techniques for reducing on resistance, such as, but not limited to, devices described in the prior art.

Furthermore, the die surface area required to terminate the high voltage device is significantly reduced. This is because the termination efficiency of the new device can be less than that of the prior art device, since the parallel plane breakdown voltage for the termination region can be made many times higher than the parallel plane breakdown voltage of the active region. To put it more succinctly, the breakdown voltage is equal to the parallel plane breakdown voltage times the termination efficiency, and the higher the efficiency the more device area the termination will consume. A device made in accordance with the present invention increases the parallel plane breakdown voltage of the termination region through an increase in the epitaxial thickness. The efficiency of the termination region can be reduced, thus reducing termination area, as long as the product of the efficiency and parallel plane voltage is higher than the parallel plane voltage of the active region.

According to one embodiment, a semiconductor device includes a substrate layer having a first dopant density, an epitaxial layer comprising a second dopant density formed on the substrate layer and a semiconductor switch formed on the epitaxial layer, wherein the semiconductor switch comprises an active region of the semiconductor device. A first thickness of the epitaxial layer in the active region is less than a second thickness of the epitaxial layer in a termination region formed peripherally to the active region.

The semiconductor switch may include a gate electrode formed on an upper surface of the epitaxial layer and the first thickness may be a distance between the upper surface of the epitaxial layer proximate the gate electrode and an upper surface of the substrate layer. The second thickness may be a distance between the upper surface of the epitaxial layer in the termination region and the upper surface of the substrate layer.

According to another embodiment, a method of forming a semiconductor device includes:

A. forming a mask over a substrate layer comprising a first semiconductor material of a first thickness and having a first dopant density, wherein the mask covers a first portion of the substrate layer;

B. removing the first semiconductor material from the portion of the substrate not covered by the mask to reduce a second portion of the substrate layer to a second thickness;

C. growing an epitaxial layer over the first and second portions of the substrate layer, such that the epitaxial layer comprises a substantially planar surface opposite a surface of the epitaxial layer which is in contact with the substrate layer, wherein the epitaxial layer includes a first epitaxial portion proximate the first portion of the substrate layer having a first epitaxial thickness and a second epitaxial portion, proximate the second portion of the substrate layer having a second epitaxial thickness; and D. forming a semiconductor switch on the substantially planar surface of the epitaxial layer proximate the second epitaxial portion;

wherein the first epitaxial thickness is substantially less than the second epitaxial thickness.

Finally, in accordance with another aspect of the invention, a method of making a semiconductor switching device comprises a substrate layer and an epitaxial layer having at least a portion lying in the active and termination regions of the device and having a desired breakdown voltage and on-resistance. The method comprises:

forming the epitaxial layer such that the epitaxial layer in the active region of the device is significantly thinner than the epitaxial layer in the termination region so as increase its breakdown voltage relative to its on-resistance.

BRIEF DESCRIPTION OF THE DRAWINGS

The foregoing and other objects of this invention, the various features thereof, as well as the invention itself may be more fully understood from the following description when read together with the accompanying drawings in which.

DETAILED DESCRIPTION

Figure 6:
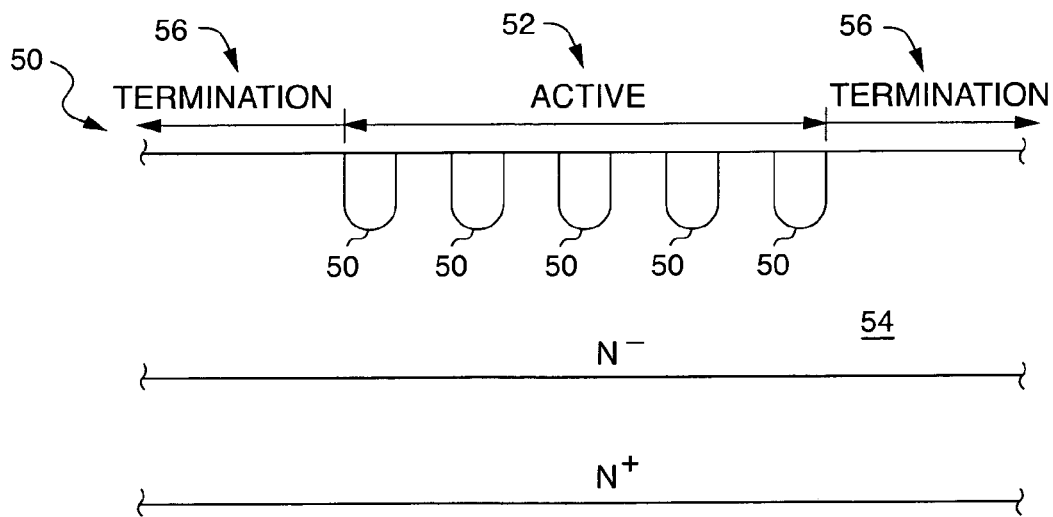
FIG. 6 is a schematic diagram of a conventional semiconductor device of the prior art showing the active and termination regions.
Figure 7:
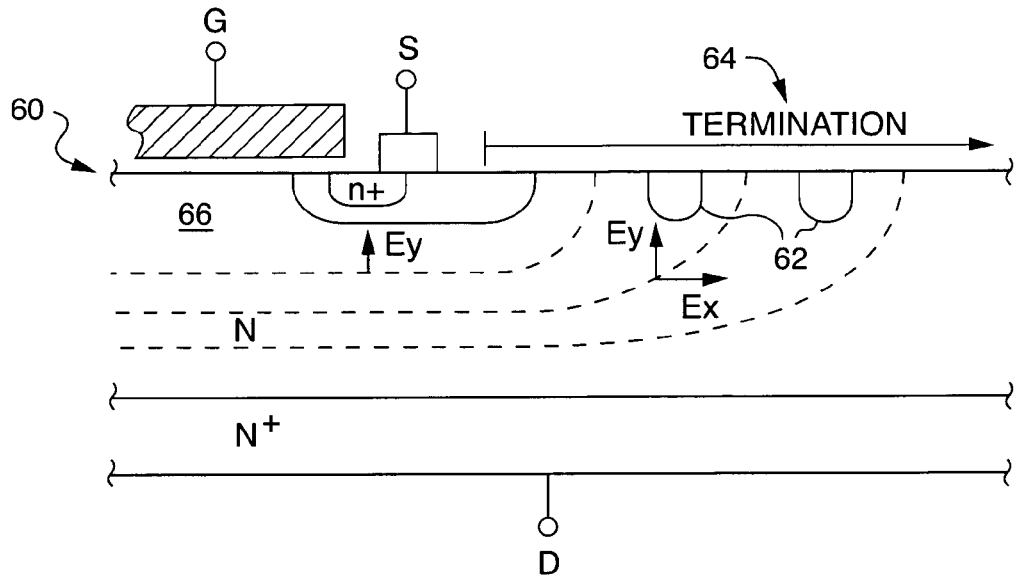
FIG. 7 is a schematic diagram of a conventional semiconductor device of the prior art showing voltage potential lines present in the termination region during operation of the device.

A typical semiconductor device configuration, shown in FIG. 6, includes many devices 50 formed in an active region 52 of the substrate 54 and a termination region 56 formed peripherally around the active region. During operation of the devices, the equipotential lines in the termination region 56 of the epitaxial layer 54 are curved, as shown at 60, FIG. 7, which reduces the breakdown voltage of the semiconductor devices. Guard rings 62 may be built into the termination 64 of the device, which help to increase the radius of the curved fields, resulting in a greater breakdown voltage. In the active region 66, the equipotential lines are generally planar, and therefore do not have as much of an effect on the breakdown voltage of the device.

The breakdown voltage of the device, which in one embodiment, may be a VDMOSFET, is generally limited by the 2-D and 3-D effects in the termination region, which are also a function of the epitaxial layer doping and thickness. Typically, because of the curved fields, the breakdown voltage in the termination region is approximately 50–80% of the planar breakdown voltage. The breakdown voltage in the active region of the device is typically the planar breakdown voltage for any given epitaxy doping and thickness. Accordingly, in order to increase the breakdown voltage of the device, the breakdown voltage of the termination region must be increased, without increasing the on-resistance of the device.

Figure 8:
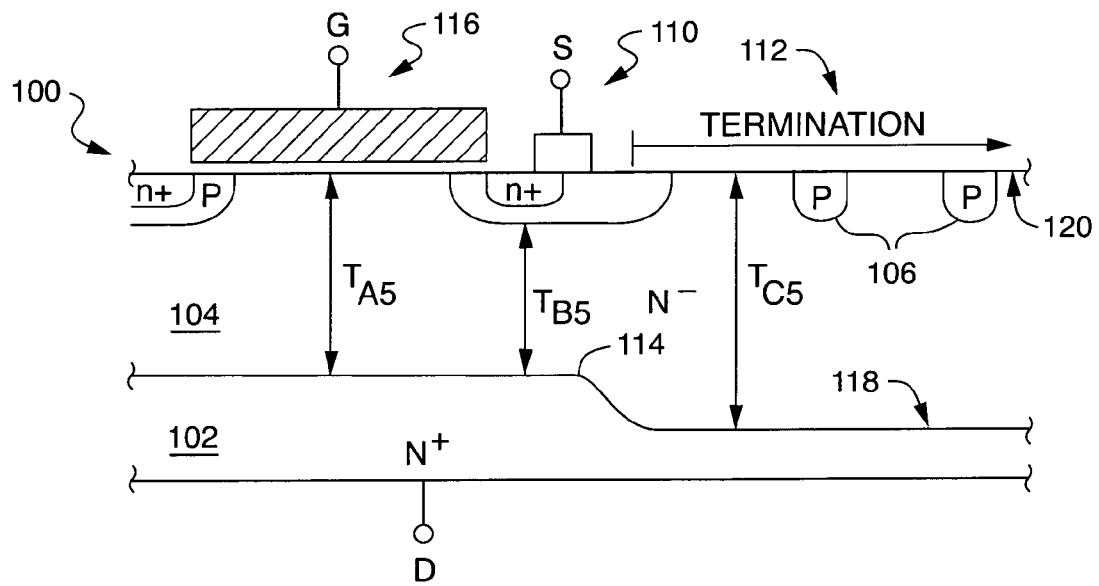
FIG. 8 is a schematic diagram of one embodiment of a semiconductor device made according to the present invention.
Figure 10:
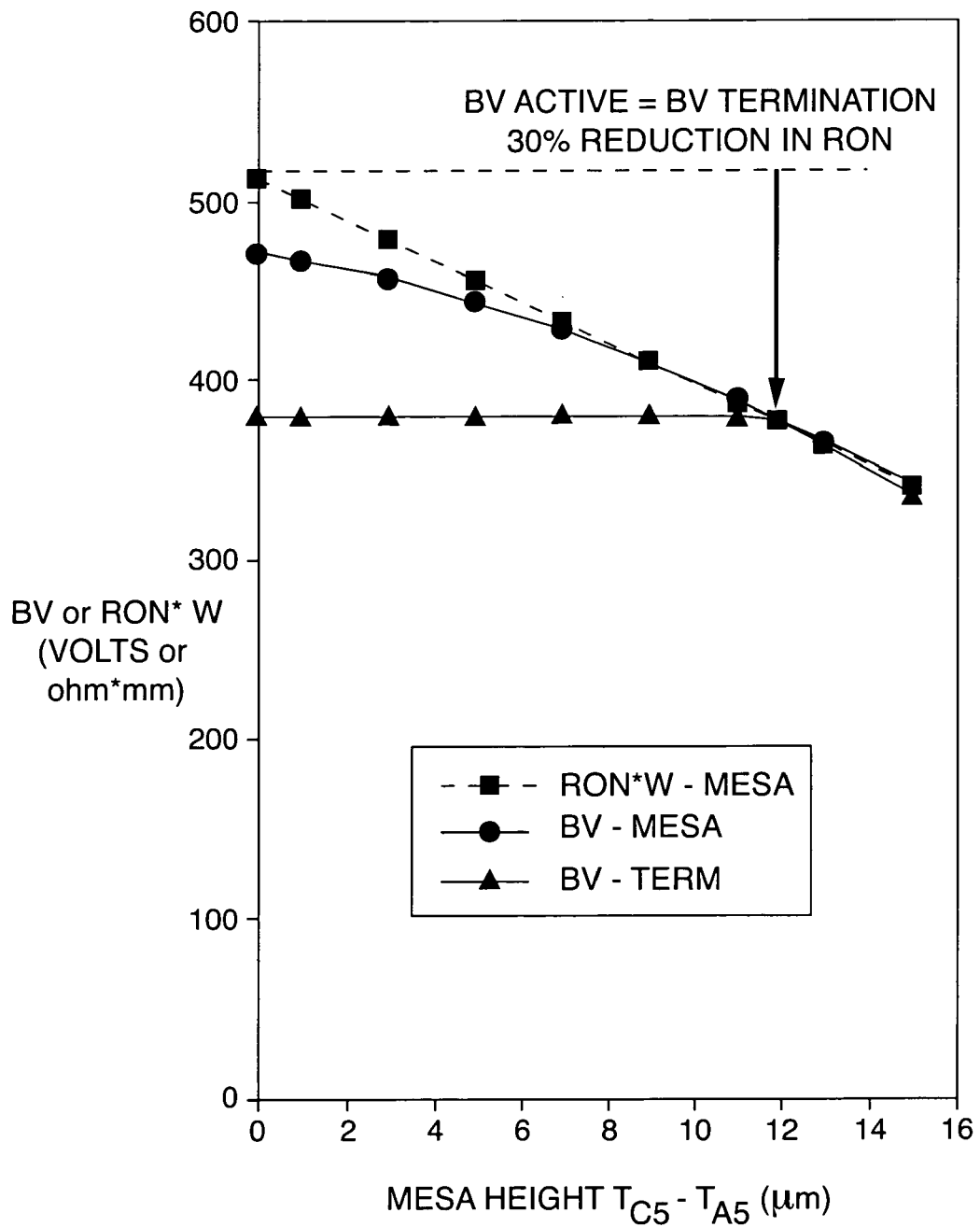
FIG. 10 is a graph showing the relationship between the mesa thickness in the epitaxial layer and the breakdown voltage and on-resistance.

FIG. 8 is a schematic diagram of a semiconductor device 100 in accordance with the present invention. In addition to the gate and source configuration similar to that shown in FIG. 1, device 100 includes substrate 102 and epitaxial layer 104, as well as P-type guard rings 106 formed in the epitaxial layer 104. As is shown in FIG. 8, the N+ substrate layer 102 is formed to be thicker in the active region 110 of the device than it is in the termination region 112. The elevated region 114 of the substrate in the active region 110 causes the thickness $T_{A2}$ between the elevated region 114 and the gate 116 to be significantly less than the thickness $T_{C2}$ between the non-elevated region 118 and the upper surface 120 of the device 100. As an example, a 350V VDMOSFET of device 10 may have an epitaxial layer 104 thickness $T_{A1}$ equal to 35 microns. Reducing $T_{A5}$ of device 100 to 23 microns while maintaining $T_{C5}$ at 35 microns reduces the on resistance of the VDMOSFET 30% while maintaining the breakdown voltage. At this point the active region breakdown and the termination breakdown are equivalent. The relationship between the thickness of the epitaxial layer 104 and the breakdown voltage and on-resistance is shown in FIG. 10. In FIG. 10, the thickness of the substrate 102 or "mesa" (equivalent to $T_{C5}$ minus $T_{A5}$) in the active region is plotted against the corresponding breakdown voltage for the device. As shown in the figure, an increase in the thickness of the mesa, which results in a decrease in the thickness ($T_{A5}$) of the epitaxial layer, results in a decrease in the breakdown voltage in the active region and a corresponding decrease in the on-resistance.

Figure 1:
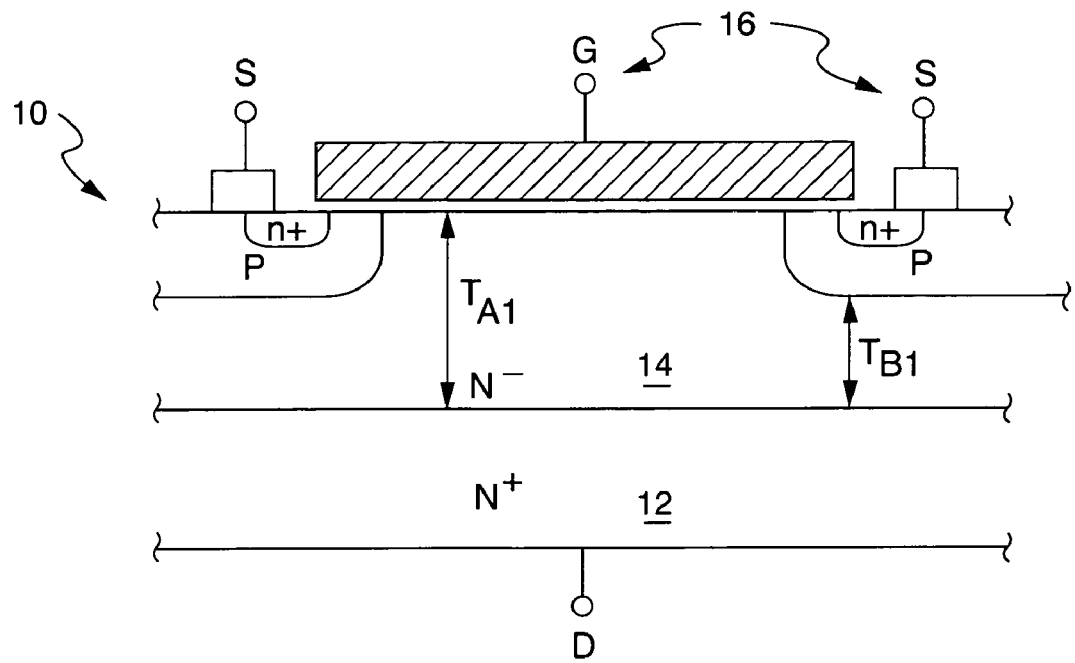
FIG. 1 is a schematic diagram of a conventional high voltage semiconductor device of the prior art.
Figure 2:
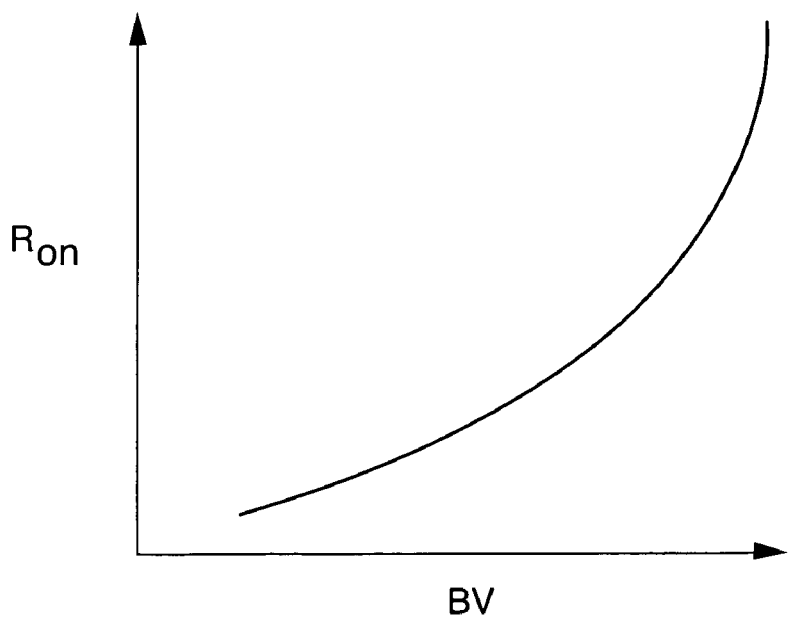
FIG. 2 is a graph showing the relationship between the on-resistance and the voltage rating of a semiconductor device.
Figure 3:
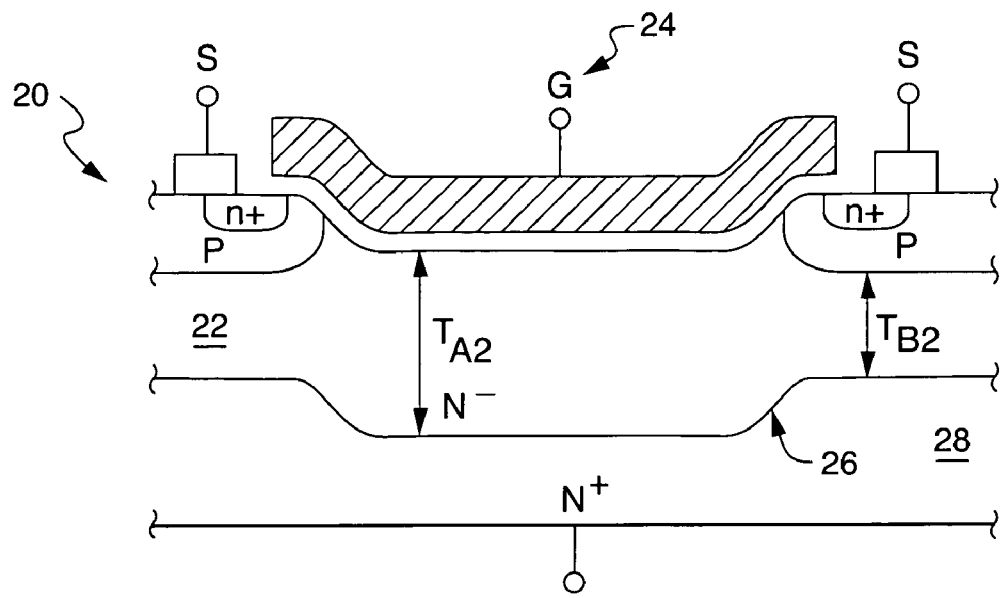
FIGS. 3–5 are schematic diagrams of modified low voltage semiconductor devices of the prior art.
Figure 4:
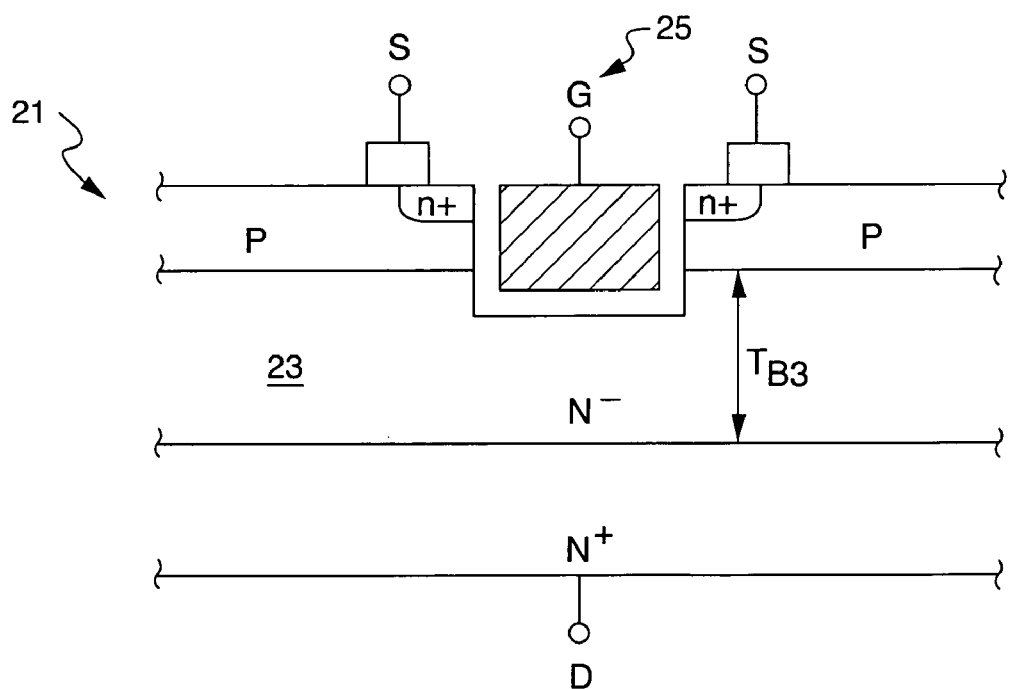
Figure 5:
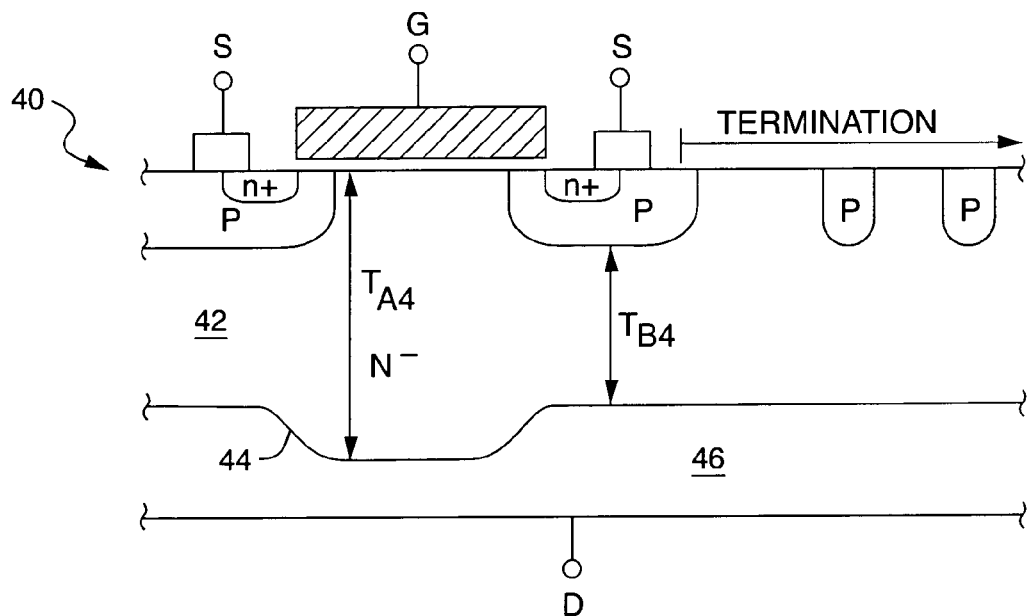

In the preferred embodiment, thicknesses $T_{A5}$ and $T_{B5}$ of device 100 are less than corresponding thicknesses $T_{A5}$ and $T_{B1}$ of device 10 of FIG. 1.

The difference in the thicknesses $T_{A5}$ and $T_{C5}$ is adjusted so that the breakdown voltage of the device is no longer limited by the edge of the device. In other words, as described above, the breakdown voltage can be maintained while reducing the on resistance by maintaining $T_{C5}$ of device 100 equal to $T_{A1}$ of device 10, but reducing the thickness of $T_{A5}$ of device 100. Conversely, since the voltage rating of the material is a function of the doping density and the thickness of the epitaxial layer, increasing the thickness in the termination region results in a higher breakdown voltage for the device without increasing the on-resistance of the device.

Figure 9:
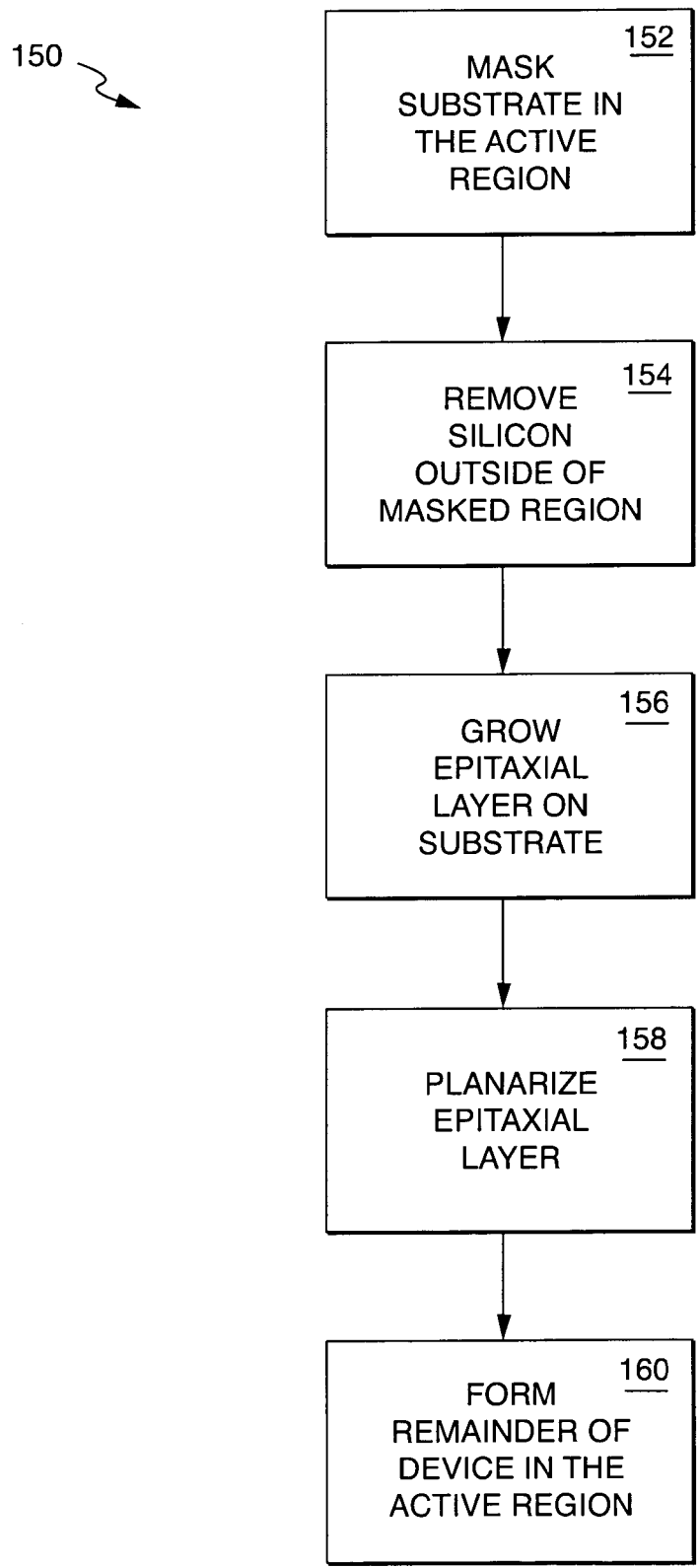
FIG. 9 is a flow diagram showing the steps involved in the manufacturing process of the semiconductor device, in accordance with the present invention.

A method of constructing the device 100 is shown in flow diagram 150 of FIG. 9. First, in step 152, the substrate 102 is masked where the active region is to be formed. The silicon is then removed from the portion of the substrate that is not masked, step 154. This step may be carried out using any known process, such as wet silicon etching or dry etching. Since the angle of the transition between the elevated region 114 and the non-elevated region 118 and the actual location of the transition is not critical to the operation of the device, the removal of the silicon material outside of the mask can be performed by any known removal method and does not require precise alignment of the mask. The epitaxial layer 104 is then grown on the substrate 102, step 156, and, if necessary, the epitaxial layer is planarized, step 158. When the epitaxial layer is relatively thin, the planarization step may be necessary to provide sufficient offset between the epitaxial layer thickness in the active region and the termination region. Thick epitaxial layers tend to self-planarize during epitaxial growth. Once the epitaxial layer is formed, a conventional device, such as a VDMOSFET, is built on the surface of the epitaxial layer 104 in the active region, step 160.

Alternatively, the device may be formed through diffusion of dopants into the substrate from the backside of the wafer or from a buried layer in order to build up the substrate 102 in the active region.

While the invention is described as pertaining to the construction and operation of a VDMOSFET, it will be understood that the invention could also be applied to other semiconductor devices, such as IGBT, Bipolar, diodes and other semiconductor high voltage devices. The invention could also be applied to P− on P+ substrates and other semiconductor materials, such as GaAs and SiC.

Accordingly, the present invention provides a semiconductor structure that provides devices formed thereon with higher breakdown voltages without increasing the on-resistance of the devices. This is accomplished by forming the substrate and epitaxial layers such that the epitaxial layer in the active region of the device is significantly thinner than the epitaxial layer in the termination region. Alternatively, the on resistance can be lowered while maintaining the desired breakdown voltage.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A semiconductor device comprising:
   a substrate layer comprising a first dopant density;
   an epitaxial layer comprising a second dopant density formed on the substrate layer; and
   a semiconductor switch formed on the epitaxial layer, wherein the semiconductor switch comprises an active region and a termination region of the semiconductor device;
   wherein the substrate and epitaxial layers are formed so as to provide a uniform thickness throughout the active and termination regions, and wherein the epitaxial layer is formed so that a first thickness of the epitaxial layer in the active region is less than a second thickness of the epitaxial layer in a termination region formed peripherally to the active region enabling the on-resistance of the semiconductor switch to be reduced without necessarily increasing the breakdown voltage of the semiconductor switch, and/or the breakdown voltage of the semiconductor switch to be increased without necessarily increasing the on-resistance of the semiconductor switch.

2. The semiconductor device of claim 1 wherein the semiconductor switch comprises a gate electrode formed on an upper surface of the epitaxial layer and the first thickness is a distance between the upper surface of the epitaxial layer proximate the gate electrode and an upper surface of the substrate layer.

3. The semiconductor device of claim 2 wherein the second thickness is a distance between the upper surface of the epitaxial layer in the termination region and the upper surface of the substrate layer.

* * * * *